US012332630B2

(12) United States Patent
Ogino et al.

(10) Patent No.: US 12,332,630 B2
(45) Date of Patent: Jun. 17, 2025

(54) INFORMATION PROCESSING APPARATUS AND SUBSTRATE PROCESSING METHOD

(71) Applicant: TOKYO ELECTRON LIMITED, Tokyo (JP)

(72) Inventors: Hiroshi Ogino, Sapporo (JP); Masanori Saito, Sapporo (JP); Noriaki Kanaya, Sapporo (JP); Yasuhiro Tsuruma, Sapporo (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 507 days.

(21) Appl. No.: 17/638,121

(22) PCT Filed: Aug. 12, 2020

(86) PCT No.: PCT/JP2020/030646
§ 371 (c)(1),
(2) Date: Feb. 24, 2022

(87) PCT Pub. No.: WO2021/039389
PCT Pub. Date: Mar. 4, 2021

(65) Prior Publication Data
US 2022/0291662 A1    Sep. 15, 2022

(30) Foreign Application Priority Data

Aug. 26, 2019   (JP) ................................. 2019-153360

(51) Int. Cl.
*G05B 19/4099*   (2006.01)
*H01L 21/67*   (2006.01)

(52) U.S. Cl.
CPC ............... *G05B 19/4099* (2013.01); *G05B 2219/45031* (2013.01); *H01L 21/67167* (2013.01)

(58) Field of Classification Search
CPC ............... G05B 19/042; G05B 19/418; G05B 19/4099; G05B 2219/32046;
(Continued)

(56) References Cited

U.S. PATENT DOCUMENTS 6,438,441 B1 * 8/2002 Jang ..................... H01L 22/20
700/121
6,871,112 B1 * 3/2005 Coss, Jr. ............... H01L 22/20
702/182

(Continued)

FOREIGN PATENT DOCUMENTS

JP     2010-061505 A    3/2010
JP     2013-535816 A    9/2013

OTHER PUBLICATIONS

International Search Report for International Application No. PCT/JP2020/030646 dated Oct. 27, 2020, 4 pp. (with English Translation).

*Primary Examiner* — M. N. Von Buhr
(74) *Attorney, Agent, or Firm* — XSENSUS LLP (57) ABSTRACT

A reception unit receives a processing instruction including a recipe. A calculation unit calculates an identifier from the recipe received by the receiving unit. A determination unit determines whether an identical identifier to the calculated identifier is stored in a memory. A control unit controls a substrate processing apparatus using an operation data item associated with the identical identifier and the recipe received by the receiving unit when the determination unit determines that the identical identifier is stored in the memory.

7 Claims, 8 Drawing Sheets

(58) Field of Classification Search
CPC ........... G05B 2219/32055; G05B 2219/32127; G05B 2219/45031; Y02P 90/02; H01L 21/02; H01L 21/67167; H01L 21/67276
See application file for complete search history.

(56) References Cited

U.S. PATENT DOCUMENTS

| | | | |
|---|---|---|---|
| 8,987,010 B1* | 3/2015 | Ayotte | H01L 22/12 |
| | | | 438/16 |
| 9,778,941 B2* | 10/2017 | Omori | G06F 9/44505 |
| 9,934,351 B2* | 4/2018 | Cantwell | G03F 7/705 |
| 11,392,110 B2* | 7/2022 | Chiba | G06Q 50/04 |
| 2005/0246051 A1* | 11/2005 | Kim | H01L 21/67253 |
| | | | 700/121 |
| 2008/0306615 A1* | 12/2008 | Morisawa | C23C 16/52 |
| | | | 700/18 |
| 2010/0057239 A1* | 3/2010 | Masuda | G05B 19/41865 |
| | | | 700/105 |
| 2017/0300044 A1* | 10/2017 | Asai | G05B 19/41875 |
| 2022/0181172 A1* | 6/2022 | Yoshida | H01L 21/30604 |

\* cited by examiner

| IDENTIFIER | OPERATION DATA ITEM |
|---|---|
| IDENTIFIER | OPERATION DATA ITEM |
| IDENTIFIER | OPERATION DATA ITEM |

INFORMATION PROCESSING APPARATUS AND SUBSTRATE PROCESSING METHOD

CROSS REFERENCE TO RELATED APPLICATION

This application is a national phase of PCT Application No. PCT/JP2020/030646, filed on 12 Aug. 2020, which claims priority from Japanese Patent Application No. 2019-153360, filed on 26 Aug. 2019, all of which are incorporated herein by reference.

TECHNICAL FIELD

The present disclosure relates to an information processing apparatus and a substrate processing method.

BACKGROUND

Patent Document 1 discloses a technique for collecting and accumulating the lot processing information including reference time information and recipes for a lot processing performed in a production equipment, and determining a lot processing order in the production equipment based on the accumulated lot processing information.

PRIOR ART DOCUMENT

Patent Document

Patent Document 1: Japanese Patent Laid-Open Publication No. 2010-061505

SUMMARY OF THE INVENTION

Problems to be Solved

The present disclosure provides a technique for suppressing a decrease in productivity while suppressing an information leak.

Means to Solve the Problems

An information processing apparatus according to an aspect of the present disclosure is connected to a substrate processing apparatus. The information processing apparatus includes a memory and a processor. The memory stores the operation data item created when a recipe serving as a processing condition of the substrate processing apparatus is executed, in associated with an identifier calculated from the recipe. The processor includes a reception unit, a calculation unit, a determination unit, and a control unit. The reception unit receives the processing instruction including a recipe. The calculation unit calculates an identifier from the recipe received by the reception unit. The determination unit determines whether an identical identifier to the calculated identifier is stored in the memory. When the determination unit determines that the identical identifier is stored in the memory, the control unit controls the substrate processing apparatus using the operation data item associated with the identical identifier and the recipe received by the reception unit.

Effect of the Invention

According to the present disclosure, a decrease in productivity may be suppressed.

DETAILED DESCRIPTION TO EXECUTE THE INVENTION

Hereinafter, embodiments of an information processing apparatus and a substrate processing method disclosed herein will be described in detail with reference to the accompanying drawings. Further, the present embodiments do not limit the disclosed information processing apparatus and substrate processing method.

In the substrate processing apparatus, it is required to delete recipes without accumulating the recipes in order to suppress an information leakage. Therefore, for example, in Patent Document 1, when the substrate processing apparatus deletes the lot processing information including recipes without accumulating such information, the processing order of production equipment may not be appropriately determined, which results in a decrease in productivity. Therefore, it is required to suppress the decrease in productivity.

[Apparatus Configuration]

Figure 1:
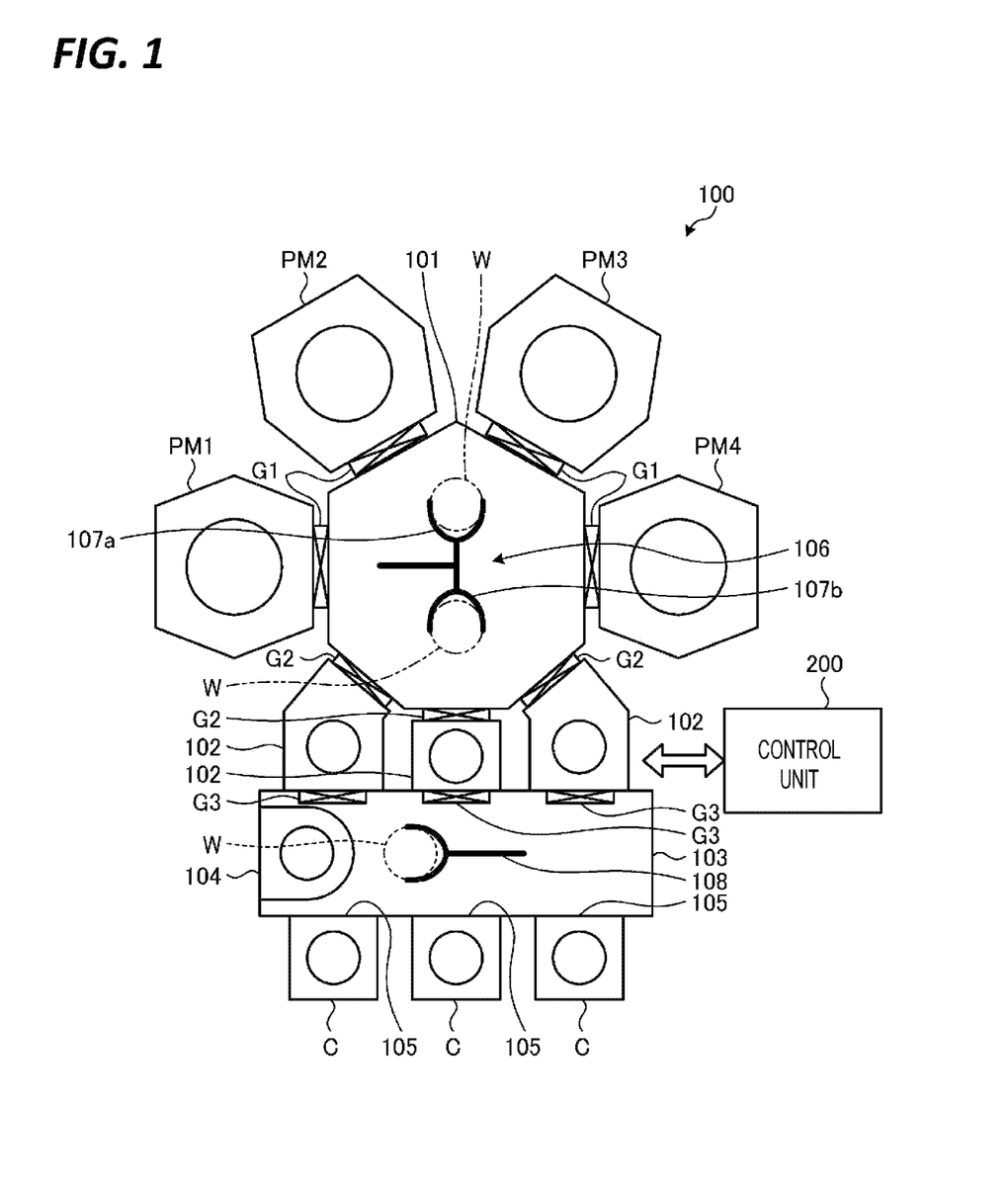
FIG. 1 is a diagram illustrating an example of an entire schematic configuration of a substrate processing apparatus according to an embodiment.

An example of the substrate processing according to an embodiment will be described. FIG. 1 is a diagram illustrating an example of an entire schematic configuration of a substrate processing apparatus 100 according to the embodiment. The substrate processing apparatus 100 according to the embodiment performs a substrate processing on a substrate.

As illustrated in FIG. 1, the substrate processing apparatus 100 has four process modules PM1 to PM4. The number of process modules PM included in the substrate processing apparatus 100 is not limited to those illustrated in the figure. Hereinafter, when it is not necessary to distinguish the four process modules PM1 to PM4 from each other, the process modules are collectively referred to as a process module PM.

The process module PM performs a substrate processing on a substrate. Examples of the substrate processing include a film formation and an etching. The substrate is a semiconductor wafer (hereinafter, also referred to as a wafer). The substrate processing may be a processing using plasma or a processing not using plasma.

The process module PM has a vacuum processing chamber such as a vacuum chamber, and performs a substrate processing on the wafer W disposed in the vacuum processing chamber. In the process module PM, the inside of the vacuum processing chamber is maintained in a reduced pressure atmosphere while the wafer W is being processed. In the substrate processing apparatus 100, each process module PM may perform the same type of substrate processing. Further, in the substrate processing apparatus 100, a certain process module PMs may perform a different type of substrate processing from other process modules PMs. For example, the substrate processing apparatus 100 may perform a plurality of types of substrate processing in a distributed manner in each process module PM.

The process module PM is connected to a transfer mechanism 106, and the wafer W is transferred by the transfer mechanism 106. For example, as illustrated in FIG. 1, the process modules PM1 to PM4 are respectively connected to the four walls of the vacuum transfer chamber 101 having a heptagonal planar shape via a gate valve G1. The inside of the vacuum transfer chamber 101 is exhausted by a vacuum pump and maintained at a predetermined degree of vacuum.

Three load lock chambers 102 are connected to the other three wall portions of the vacuum transfer chamber 101 via a gate valve G2. An atmosphere transfer chamber 103 is provided on the opposite side of the vacuum transfer chamber 101 with the load lock chambers 102 interposed therebetween. The three load lock chambers 102 are connected to the atmosphere transfer chamber 103 via a gate valve G3. The load lock chambers 102 control the pressure between the atmospheric pressure and the vacuum when the wafer W is transferred between the atmosphere transfer chamber 103 and the vacuum transfer chamber 101.

The atmosphere transfer chamber 103 is provided with three carrier mounting ports 105 for mounting carriers (FOUPs, etc.) C for accommodating wafers W on a wall portion opposite to the wall portion to which the load lock chamber 102 is mounted. Further, the atmosphere transfer chamber 103 is provided with an alignment chamber 104 on the side wall for aligning the wafers W. In the atmosphere transfer chamber 103, a downflow of clean air is formed therein.

The vacuum transfer chamber 101 has a transfer mechanism 106 provided therein. The transfer mechanism 106 transfers the wafers W to the process modules PM1 to PM4 and the load lock chamber 102. The transfer mechanism 106 has two transfer arms 107*a* and 107*b* that may move independently.

The atmosphere transfer chamber 103 has a transfer mechanism 108 provided therein. The transfer mechanism 108 transfers the wafers W to the carrier C, the load lock chamber 102, and the alignment chamber 104.

The substrate processing apparatus 100 includes an information processing apparatus 200 that controls the substrate processing apparatus 100. The information processing apparatus 200 is configured as, for example, a computer, and controls each component of the substrate processing apparatus 100. For example, the information processing apparatus 200 controls each component of the process modules PM1 to PM4, an exhaust mechanism of the vacuum transfer chamber 101, a gas supply mechanism, and the transfer mechanism 106. Further, the information processing apparatus 200 controls the exhaust mechanism and gas supply mechanism of the load lock chamber 102, the transfer mechanism 108 of the atmosphere transfer chamber 103, and the drive system of gate valves G1, G2, and G3.

[Configuration of Information Processing Apparatus]

Figure 2:
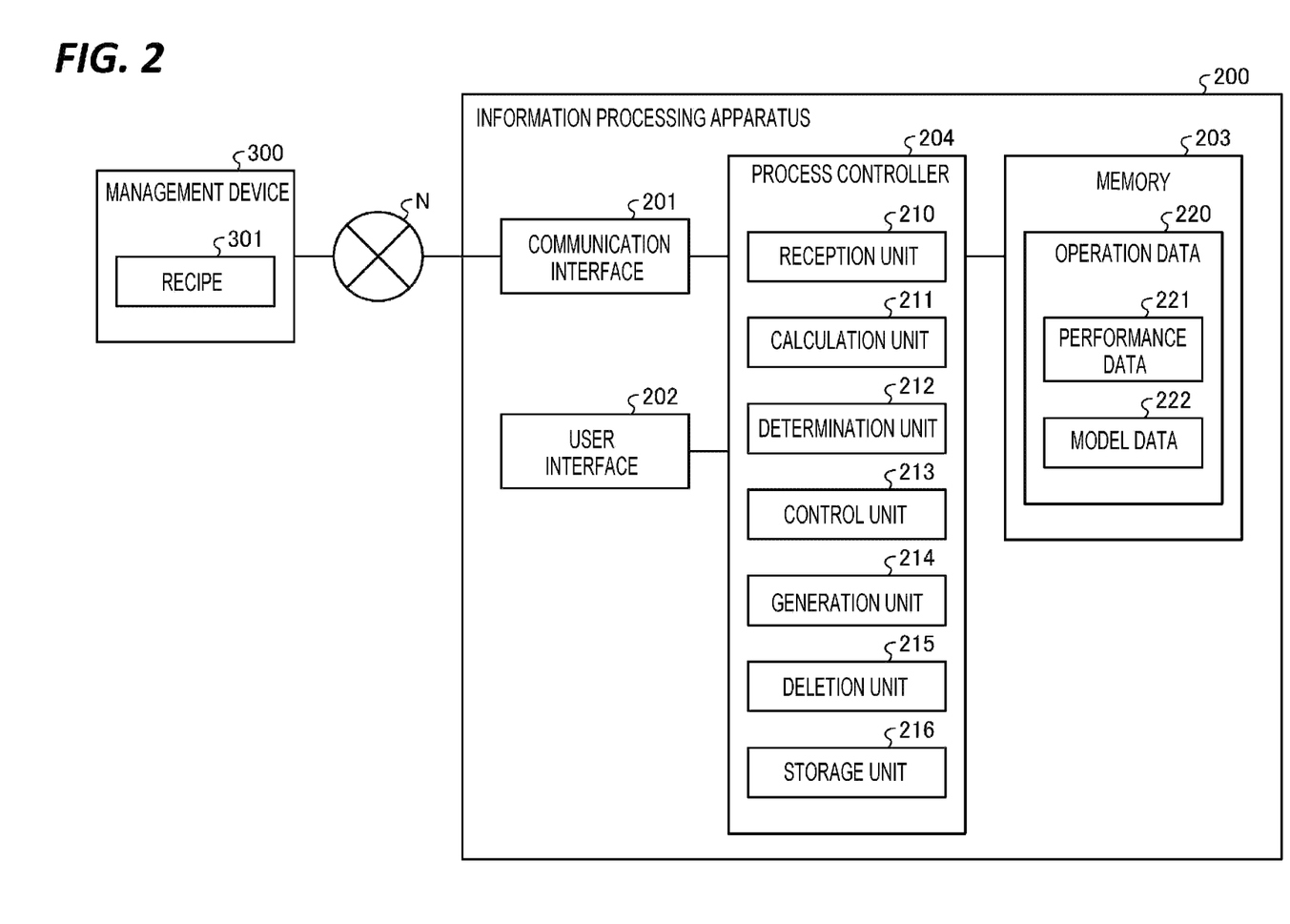
FIG. 2 is a block diagram illustrating a schematic configuration of an information processing apparatus that controls the substrate processing apparatus according to the embodiment.

Next, the information processing apparatus 200 will be described in detail. FIG. 2 is a block diagram illustrating a schematic configuration of the information processing apparatus 200 that controls the substrate processing apparatus 100 according to the embodiment. The information processing apparatus 200 includes a communication interface 201, a user interface 202, a memory 203, and a process controller 204.

The communication interface 201 is communicably connected to a management device 300 via a network N.

The management device 300 is, for example, a computer such as a personal computer or a server computer. The management device 300 manages various types of information related to the substrate processing. For example, the management device 300 manages recipes 301 for various types of substrate processing.

The recipes 301 are data that include processing conditions for substrate processing. As for the processing conditions for substrate processing, for example, pressure conditions, temperature conditions, gas conditions such as a gas type and a flow rate, substrate processing time, termination conditions for ending the substrate processing, and abnormal termination conditions for abnormally ending the substrate processing are specified as necessary. When the substrate processing apparatus 100 performs the substrate processing, the management device 300 transmits a recipe 301 including the processing conditions of the substrate processing to be performed to the substrate processing apparatus 100.

The user interface 202 includes a keyboard for a process manager to input commands for managing the substrate processing apparatus 100, and a display for visualizing and displaying the operating status of the substrate processing apparatus 100.

Figure 3:
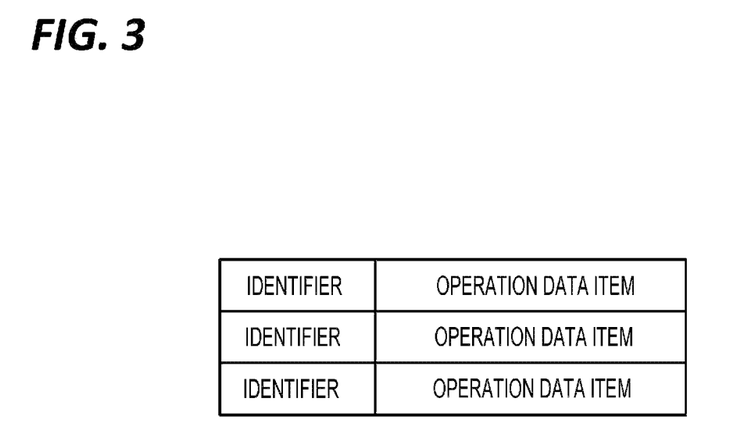
FIG. 3 is a diagram schematically illustrating a data configuration of data stored in a memory 203 according to the embodiment.

The memory 203 is, for example, a non-volatile storage device such as a hard disk or a solid state drive (SSD). The memory 203 stores various programs including a control program for controlling the substrate processing. Further, the memory 203 stores various types of data. For example, the memory 203 stores the operation data item created when the recipe 301 is executed and the identifier calculated from the recipe 301 in association with each other. FIG. 3 is a diagram schematically illustrating a data configuration of data stored in the memory 203 according to the embodiment. Operation data items are stored in the memory 203 in association with identifiers. In the present embodiment, operation data 220 of the substrate processing performed by the substrate processing apparatus 100 is stored as an operation data item in the memory 203 in association with an identifier. Details of the operation data 220 will be described later.

The process controller 204 has an internal memory such as a central processing unit (CPU) or a cache for temporarily storing programs and data, and controls each part of the substrate processing apparatus 100. The process controller 204 reads the control program stored in the memory 203 and executes the processing of the read control program. The process controller 204 functions as various processing units by operating the control program. For example, the process controller 204 has the functions of a reception unit 210, a calculation unit 211, a determination unit 212, a control unit 213, a generation unit 214, a deletion unit 215, and a storage unit 216. In the present embodiment, as an example, descriptions have been made on a case where the process controller 204 functions as various processing units, but the present disclosure is not limited thereto. For example, the functions of the reception unit 210, the calculation unit 211, the determination unit 212, the control unit 213, the generation unit 214, the deletion unit 215, and the storage unit 216 may be distributed by a plurality of controllers.

The reception unit 210 receives various types of data. When the substrate processing is performed, the management device 300 transmits various types of information regarding the substrate processing to the substrate processing apparatus 100 via the network N. For example, the management device 300 transmits the recipe 301 of the substrate processing to be performed on the wafer W to the substrate processing apparatus 100 via the network N. The recipe 301 includes processing conditions for substrate processing. The recipe 301 is also assigned a recipe identification (ID) that identifies the recipe 301. The recipe 301 is input to the communication interface 201 via the network N. The reception unit 210 receives the recipe 301 via the communication interface 201. The reception unit 210 stores the received recipe 301 in the memory 203.

Although the recipe 301 includes the processing conditions for the substrate processing, the processing time for the substrate processing may not be determined from the processing conditions. For example, the termination condition may be set in the substrate processing so that the substrate processing is continued until the state in the wafer W or the process module PM satisfies a specific condition. For example, when the wafer W detected by a temperature sensor or a process temperature reaches a specific temperature, the termination condition of ending the substrate processing may be set. In such a case, since the substrate processing apparatus 100 has a different degree of change in the wafer W and the process temperature for each model, the processing time differs for each model. Further, even when the substrate processing apparatus 100 is of the same model, there are instrumental errors, and the temperature characteristics are different for each process module PM. Therefore, in the substrate processing apparatus 100, even when the same substrate processing is performed in each process module PM, the processing time differs for each process module PM. In this case, the processing time of the substrate processing may not be accurately predicted from the processing conditions of the substrate processing.

Therefore, in the present embodiment, the memory 203 stores the operation data 220 when the substrate processing of the processing conditions included in the recipe 301 is performed in association with the identifier of the recipe 301.

A recipe ID is assigned to the recipe 301. Therefore, it is conceivable to use the recipe ID as an identifier for identifying the recipe 301. However, the recipe 301 may be assigned the same recipe ID even when a part of the processing conditions is changed. That is, the recipe 301 may have different processing conditions included in the recipe 301 even when the recipe ID is the same.

Therefore, in the present embodiment, the error detection code calculated from the recipe 301 is used as the identifier of the recipe 301. Examples of the error code detection include a check code calculated by the operation of an error detection code such as a cyclic redundancy check (CRC). The memory 203 stores the operation data 220 when the substrate processing of the processing conditions included in the recipe 301 is performed, in association with the check code of the recipe 301. In the present embodiment, as an example, descriptions will be made on the case where the check code is used as the identifier of the recipe 301, but the present disclosure is not limited thereto. The recipe ID and the check code may be used as the identifier of the recipe 301. Further, check codes of two or more types may be used as identifiers.

The operation data 220 according to the present embodiment includes performance data 221 and model data 222. The performance data 221 stores the performance values when the substrate processing is performed by each process module PM. For example, the processing time when the substrate processing is performed is stored for each process module PM in the performance data 221. The model data 222 stores an information model used for controlling the substrate processing in each process module PM. For example, the model data 222 stores process model data in which the temperature of the process is associated with the substrate processing rate such as a deposition rate and an etching rate for each process module PM. Further, the model data 222 stores FD model data such as parameters and calculation formulas for calculating an appropriate abnormality detection threshold value for each process module PM.

The calculation unit 211 calculates an identifier from the received recipe 301. For example, the calculation unit 211 calculates a check code from the recipe 301 by calculating an error detection code.

The determination unit 212 determines whether the same identifier as the calculated identifier is stored in the memory 203. For example, the determination unit 212 determines whether the operation data 220 associated with the calculated check code is stored in the memory 203. When the recipe ID and the check code are used as the identifiers of the recipe 301, the determination unit 212 determines whether the operation data 220 associated with the recipe ID and the check code is stored in the memory 203.

The control unit 213 controls the execution of the substrate processing. For example, when the determination unit 212 determines that the same identifier is stored in the memory 203, the control unit 213 controls the substrate processing apparatus 100 by using the operation data item associated with the identifier and the received recipe 301. As an example, the control unit 213 creates a processing schedule for causing the substrate processing apparatus 100 to execute the substrate processing of the processing conditions included in the recipe 301. When it is determined that the operation data 220 is not stored in the memory 203, the control unit 213 creates a processing schedule for the substrate processing from the recipe 301. For example, when the processing time is recorded in the processing conditions included in the recipe 301, the control unit 213 creates a processing schedule using the recorded processing time. For example, the control unit 213 creates a schedule for the processing period of the substrate processing in each process module PM by setting the processing time of the substrate processing in each process module PM as the processing time of the processing conditions included in the recipe 301. Further, the control unit 213 creates a transfer schedule for transferring the wafer W to each process module PM according to the processing period of each process module PM.

In the recipe 301, the processing time may not be set in the processing conditions, and a termination condition for ending the substrate processing may be determined. For example, when the wafer W or the process temperature reaches a specific temperature, the termination condition for ending the substrate processing may be determined. In this case, the substrate processing is not ended unless the wafer W or the process temperature reaches a specific temperature. Therefore, an abnormal termination condition for abnormally ending the substrate is determined in the processing conditions. For example, even when the wafer W or the process temperature does not reach a specific temperature, an abnormal termination condition is determined to end the substrate processing for which the processing time for the substrate processing is longer than a certain time. The abnormal termination condition is determined with sufficient margin for the processing time when the substrate processing is normal. For example, when the substrate processing is normal and the wafer W or the process temperature reaches a predetermined temperature in about 1 minute, the abnormal termination condition is set to 10 minutes.

When the processing time is not recorded in the processing conditions included in the recipe 301, the control unit 213 creates a processing schedule using the abnormal termination condition. For example, the control unit 213 creates a schedule for the processing period of the substrate processing in each process module PM by setting the processing time of the substrate processing in each process module PM as the time of the abnormal termination condition. Further, the control unit 213 creates a transfer schedule of the wafer W according to the processing period of each process module PM. The abnormal termination condition is determined with sufficient margin for the processing time when the substrate processing is normal. Therefore, the control unit 213 may create a processing schedule by setting the processing time of the substrate processing in each process module PM to a fixed ratio of the time of the abnormal termination condition. For example, as described above, when the abnormal termination condition is set to 10 minutes, the processing schedule may be created by setting the processing time of the substrate processing in each process module PM to 5 minutes, which is 50% of 10 minutes of the abnormal termination condition. Further, the control unit 213 may create a processing schedule by setting the processing time of the substrate processing in each process module PM as a preset specific time.

Meanwhile, when it is determined that the operation data 220 is stored in the memory 203, the control unit 213 creates a processing schedule using the operation data 220. For example, the control unit 213 creates a schedule for the processing period of the substrate processing in each process module PM by setting the processing time of the substrate processing in each process module PM as the processing time of the corresponding process module PM recorded in the operation data 220. Further, the control unit 213 creates a transfer schedule of the wafer W according to the processing period of each process module PM.

The control unit 213 controls performing the substrate processing of the processing conditions included in the recipe 301 based on the created processing schedule. When performing the substrate processing, the control unit 213 first reads the recipe 301 stored in the memory 203 into the internal memory. Then, the control unit 213 executes the substrate processing of the processing conditions included in the recipe 301 stored in the internal memory according to the processing schedule. For example, the control unit 213 transfers the wafers W from the carrier C to each process module PM in order based on the transfer schedule included in the processing schedule, and controls performing a substrate processing in each process module PM based on the read recipe 301. Further, when it is determined that the operation data 220 is stored in the memory 203, the control unit 213 controls the substrate processing by using the model data 222 included in the operation data 220. For example, the control unit 213 uses the process model data stored in the model data 222 to adjust the process temperature of each process module PM so that the substrate processing rate of each process module PM becomes a predetermined rate according to the processing conditions. Further, the control unit 213 calculates the threshold value for abnormality detection corresponding to the processing conditions for each process module PM by using the FD model data stored in the model data 222.

Figure 4A:
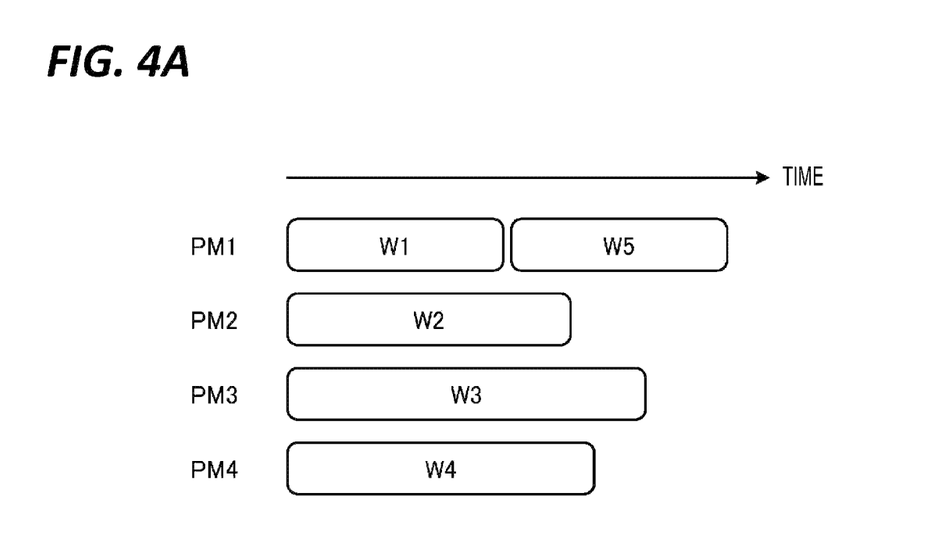
FIG. 4A is a diagram illustrating an example of a processing schedule for substrate processing according to the embodiment.
Figure 4B:
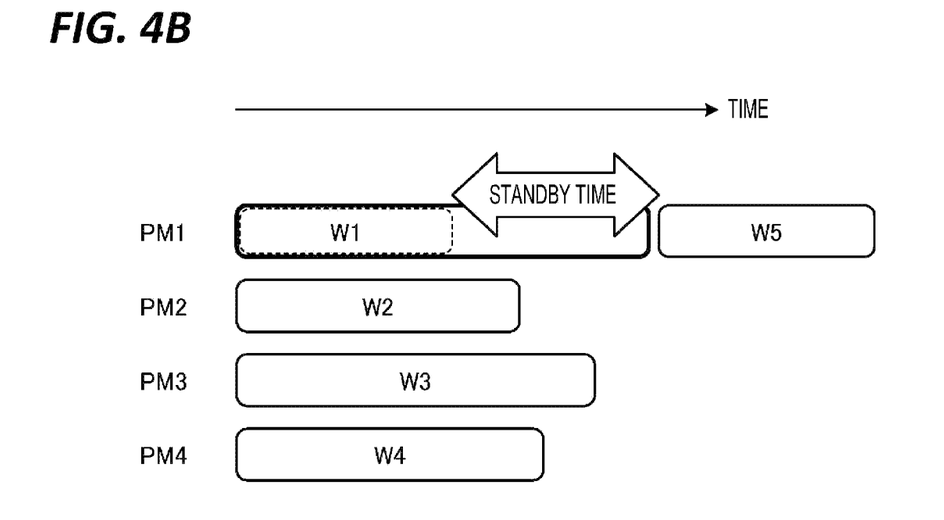
FIG. 4B is a diagram illustrating an example of a processing schedule for substrate processing according to the embodiment.

When it is determined that the operation data 220 associated with the identifier of the recipe 301 is not stored in the memory 203, the processing time of the substrate processing may not be predicted accurately. Therefore, the processing period of the actual substrate processing in each process module PM may change significantly from the processing schedule. FIG. 4A is a diagram illustrating an example of a processing schedule for substrate processing according to the embodiment. FIG. 4A illustrates a processing schedule for performing a substrate processing of the five wafers W1 to W5 dispersed in the process modules PM1 to PM4. Symbols "W1" to "W5" indicate the processing period of the substrate processing of the wafers W1 to W5 in the process modules PM1 to PM4. In the processing schedule of FIG. 4A, the processing period of the wafer W1 in the process module PM1 is scheduled to end earlier than the processing period of the wafers W2 to W4 in the process modules PM2 to PM4. Therefore, in the processing schedule of FIG. 4A, the substrate processing of the wafer W5 is scheduled in the process module PM1. However, in the actual substrate processing, the processing period of the wafer W1 in the process module PM1 may be longer than scheduled. FIG. 4B is a diagram illustrating an example of a processing schedule for substrate processing according to the embodiment. FIG. 4B illustrates the processing period of the actual substrate processing of the wafers W1 to W5 in the process modules PM1 to PM4. In FIG. 4B, the processing period of the wafer W1 in the process module PM1 becomes longer. In this case, the substrate processing of the wafer W5 in the process module PM1 is slowed down, which reduces productivity.

Figure 5A:
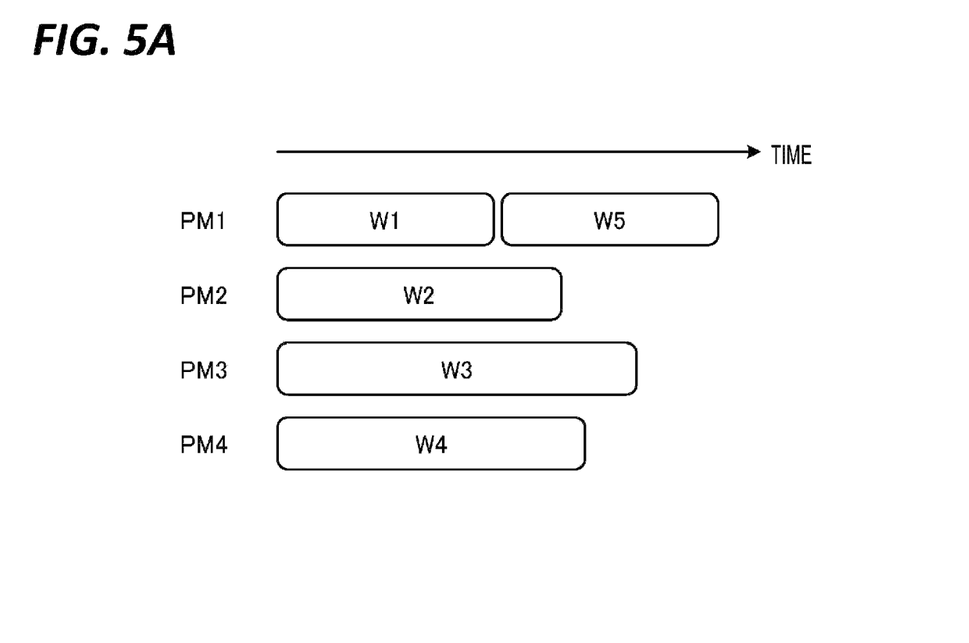
FIG. 5A is a diagram illustrating an example of a processing schedule for substrate processing according to the embodiment.
Figure 5B:
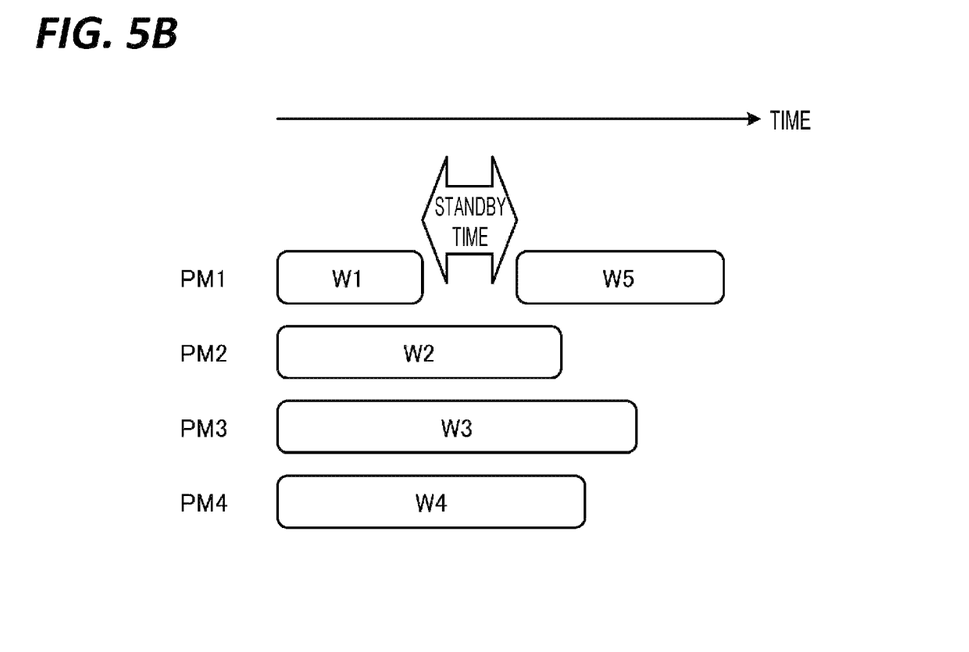
FIG. 5B is a diagram illustrating an example of a processing schedule for substrate processing according to the embodiment.

FIG. 5A is a diagram illustrating an example of a processing schedule for substrate processing according to the embodiment. FIG. 5A illustrates the same processing schedule as in FIG. 4A. Also, in the processing schedule of FIG. 5A, the substrate processing of the wafer W5 is scheduled to be performed after the substrate processing of the wafer W1 in the process module PM1. In this case, a transfer schedule is created so that the wafer W5 is transferred to the process module PM1 at the timing of starting the substrate processing of the wafer W5. However, in the actual substrate processing, the processing period of the wafer W1 in the process module PM1 may be longer than planned. FIG. 5B is a diagram illustrating an example of a processing schedule for substrate processing according to the embodiment. FIG. 5B illustrates the processing period of the actual substrate processing of the wafers W1 to W5 in the process modules PM1 to PM4. In FIG. 5B, the processing period of the wafer W1 in the process module PM1 becomes shorter. In this case, the wafer W5 has not yet been transferred to the process module PM1, and the process module PM1 waits for the wafer W5 to be transferred, which results in a decrease in productivity.

Figure 6:
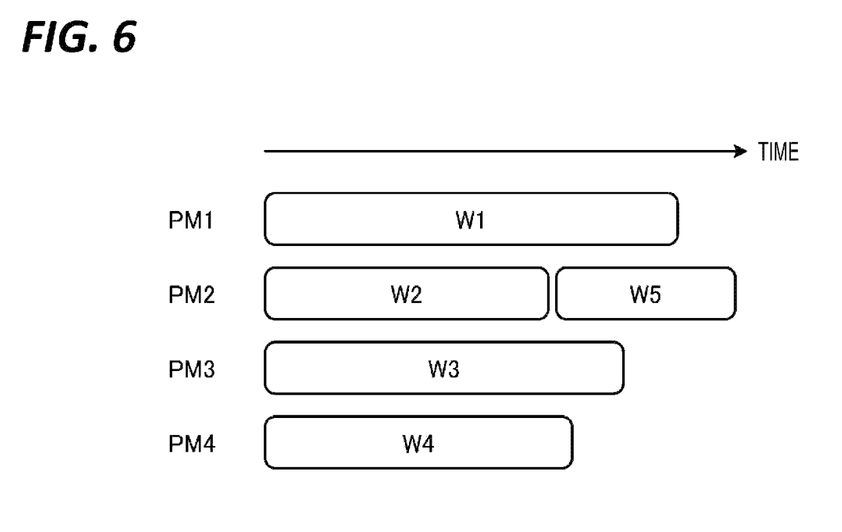
FIG. 6 is a diagram illustrating an example of a processing schedule for substrate processing according to the embodiment.
Figure 7:
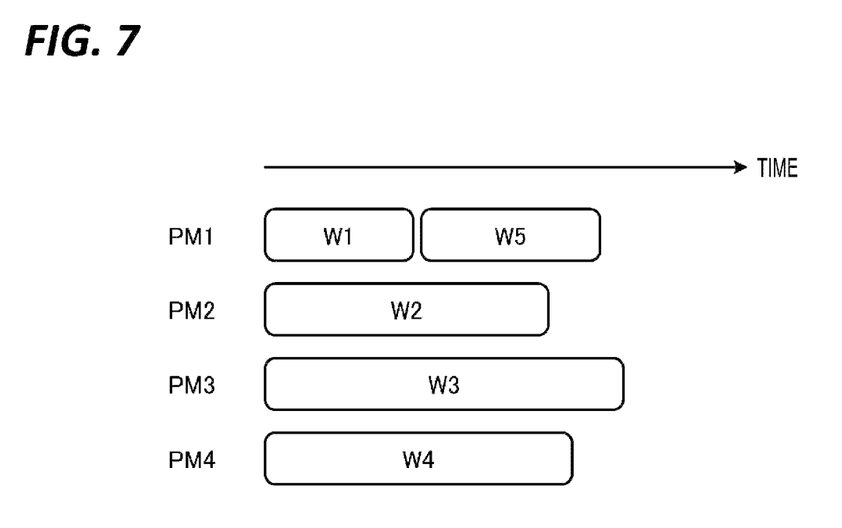
FIG. 7 is a diagram illustrating an example of a processing schedule for substrate processing according to the embodiment.

Meanwhile, when it is determined that the operation data 220 associated with the identifier of the recipe 301 is stored in the memory 203, the processing time of the substrate processing in each process module PM may be accurately predicted from the operation data 220. As a result, the control unit 213 may create an efficient processing schedule. FIGS. 6 and 7 are diagrams illustrating an example of a processing schedule for substrate processing according to the embodiment. For example, when the processing period of the wafer W1 in the process module PM1 is long as illustrated in FIG. 4B, a processing schedule may be created to perform the substrate processing of the wafer W5 in the process module PM2 as illustrated in FIG. 6. Further, for example, when the processing period of the wafer W1 in the process module PM1 is short as illustrated in FIG. 5B, a processing schedule may be created to perform the substrate processing of the wafer W5 in the process module PM1 as illustrated in FIG. 7. In this way, when the operation data 220 associated with the identifier of the recipe 301 is stored in the memory 203, since the control unit 213 may create an efficient processing schedule from the operation data 220, it is possible to suppress a decrease in productivity.

FIG. 2 is referred back to. The generation unit 214 generates an operation data item when the substrate processing apparatus 100 performs the substrate processing under the control of the control unit 213. As an operation data item, the generation unit 214 generates operation data 220 that stores the performance values of the substrate processing when the substrate processing is performed under the control of the control unit 213. For example, the generation unit 214 generates performance data 221 that records the processing time when the substrate processing is performed for each process module PM. Further, the generation unit 214 generates model data 222 from the execution result of the substrate processing as an operation data item. For example, the generation unit 214 generates process model data in which the actual process temperature and the substrate processing rate are associated with each process module PM. Further, the generation unit 214 generates an FD model for calculating an appropriate abnormality detection threshold value by adjusting parameters and arithmetic expressions according to the actual substrate processing for each process module PM. The generation unit 214 may generate data of differences from the standard information model as model data 222. For example, the generation unit 214 may generate data of differences as process model data for each process module PM with respect to standard process model data of process temperature and substrate processing rate.

In a case where the substrate processing apparatus 100 stores the recipe 301 received by the reception unit 210 in the memory 203, an information leakage may occur. For example, the recipe 301 stored in the memory 203 may be copied, transferred to another apparatus, or referenced from the user interface 202, which may cause a leakage of the processing conditions for substrate processing.

Therefore, the deletion unit 215 deletes the recipe 301 stored in the memory 203 after starting the substrate processing under the control of the control unit 213. For example, when the control unit 213 completes reading the recipe 301 into the internal memory, the deletion unit 215 deletes the recipe 301 stored in the memory 203. Also, the deletion unit 215 may delete the recipe 301 at a predetermined timing. For example, upon receiving an instruction to delete the recipe 301 from the management device 300, the deletion unit 215 may delete the recipe 301. Thus, an administrator of the management device 300 may determine the operation of the timing of deleting the recipe 301.

As a result, the substrate processing apparatus 100 may suppress the leakage of the recipe 301.

The storage unit 216 performs various types of storage. When the operation data item associated with the identifier included in the recipe 301 received by the reception unit 210 is not stored in the memory 203, the storage unit 216 stores the operation data item generated by the generation unit 214 in the memory 203 in association with the identifier included in the received recipe 301. For example, the storage unit 216 temporarily stores the identifier of the recipe 301 received by the reception unit 210. For example, when the reception unit 210 receives the recipe 301, the storage unit 216 temporarily stores the check code calculated from the recipe 301 in the internal memory. A timing for temporarily storing the check code may be any time as long as the timing is before the deletion unit 215 deletes the recipe 301. For example, the storage unit 216 may temporarily store the check code after the reading of the recipe 301 by the control unit 213 is completed and before the deletion unit 215 deletes the recipe 301. Then, the storage unit 216 stores the operation data 220 generated by the generation unit 214 in the memory 203 in association with the identifier temporarily stored in the internal memory. For example, the storage unit 216 stores the operation data 220 generated by the generation unit 214 in the memory 203 in association with the temporarily stored check code after the substrate processing under the control of the control unit 213 is completed. When the operation data 220 is not stored in the memory 203 in association with the identifier, the storage unit 216 overwrites and stores the operation data 220 generated by the generation unit 214. When the recipe ID and the check code are used as the identifier of the recipe 301, the storage unit 216 may temporarily store the recipe ID together with the check code as identifiers, and store the operation data 220 generated by the generation unit 214 in the memory 203 in association with the temporarily stored check code and recipe ID.

Meanwhile, when the operation data 220 is already stored in the memory 203 in association with the identifier, the storage unit 216 deletes the operation data 220 generated by the generation unit 214 without storing the operation data 220. As a result, the memory 203 may store the operation data 220 for each identifier. When the operation data 220 is already stored in the memory 203 in association with the identifier, the storage unit 216 may overwrite and store the operation data 220 generated by the generation unit 214. Further, when the operation data 220 is already stored in the memory 203 in association with the identifier, the storage unit 216 may further store the operation data 220 generated by the generation unit 214 in the memory 203 in association with the identifier.

As a result, the substrate processing apparatus 100 may create a processing schedule for the substrate processing using the operation data 220 when performing the substrate processing of the recipe 301 having the same identifier, so that the decrease in productivity may be suppressed.

[Flow of Control]

Figure 8:
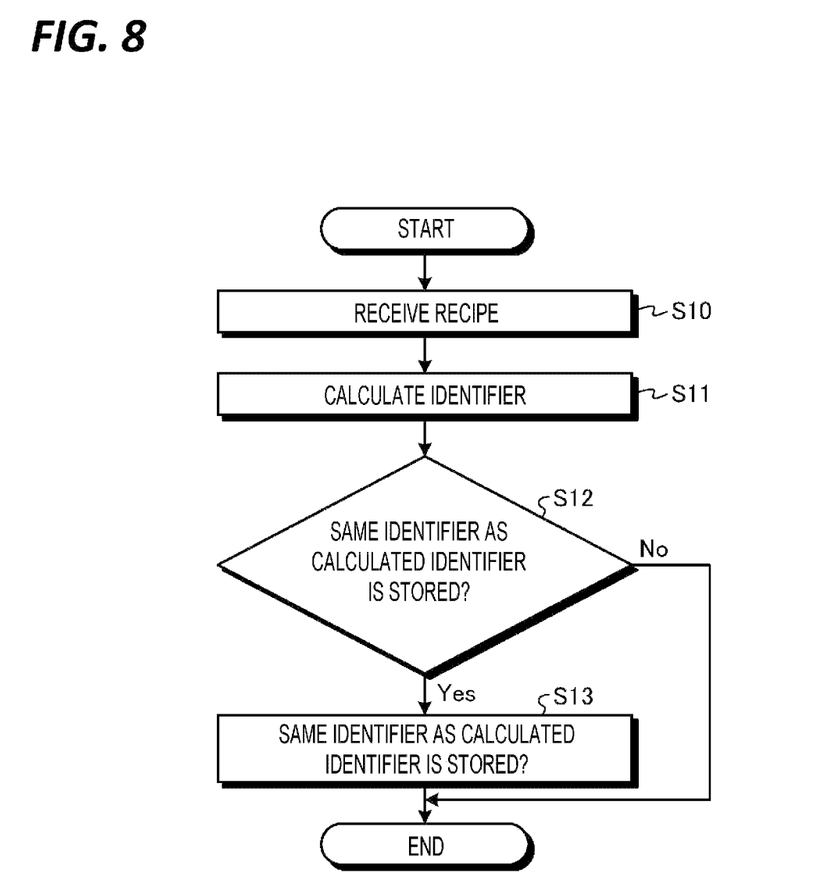
FIG. 8 is a flow chart illustrating an example of the flow of the association processing according to the embodiment.

Next, a substrate processing method according to the present embodiment will be described. First, an association processing of associating the recipe 301 with the operation data item will be described. FIG. 8 is a flow chart illustrating an example of the flow of the association processing according to the embodiment. The association processing is executed at a predetermined timing, for example, at the timing when the recipe 301 is input to the communication interface 201 from the management device 300 via the network N.

The reception unit 210 receives the recipe 301 via the communication interface 201 and stores the received recipe 301 in the memory 203 (step S10).

The calculation unit 211 calculates the identifier from the received recipe 301 (step S11). For example, the calculation unit 211 calculates a check code from the recipe 301 by calculating an error detection code.

The determination unit 212 determines whether the same identifier as the calculated identifier is stored in the memory 203 (step S12). For example, the determination unit 212 determines whether the operation data 220 associated with the calculated check code is stored in the memory 203.

When it is determined that the same identifier as the calculated identifier is stored in the memory 203, the determination unit 212 ends a process of associating the operation data item associated with the identifier, with the received recipe 301 (step S13). For example, the determination unit 212 associates the operation data 220 associated with the calculated check code, with the recipe 301.

Figure 9:
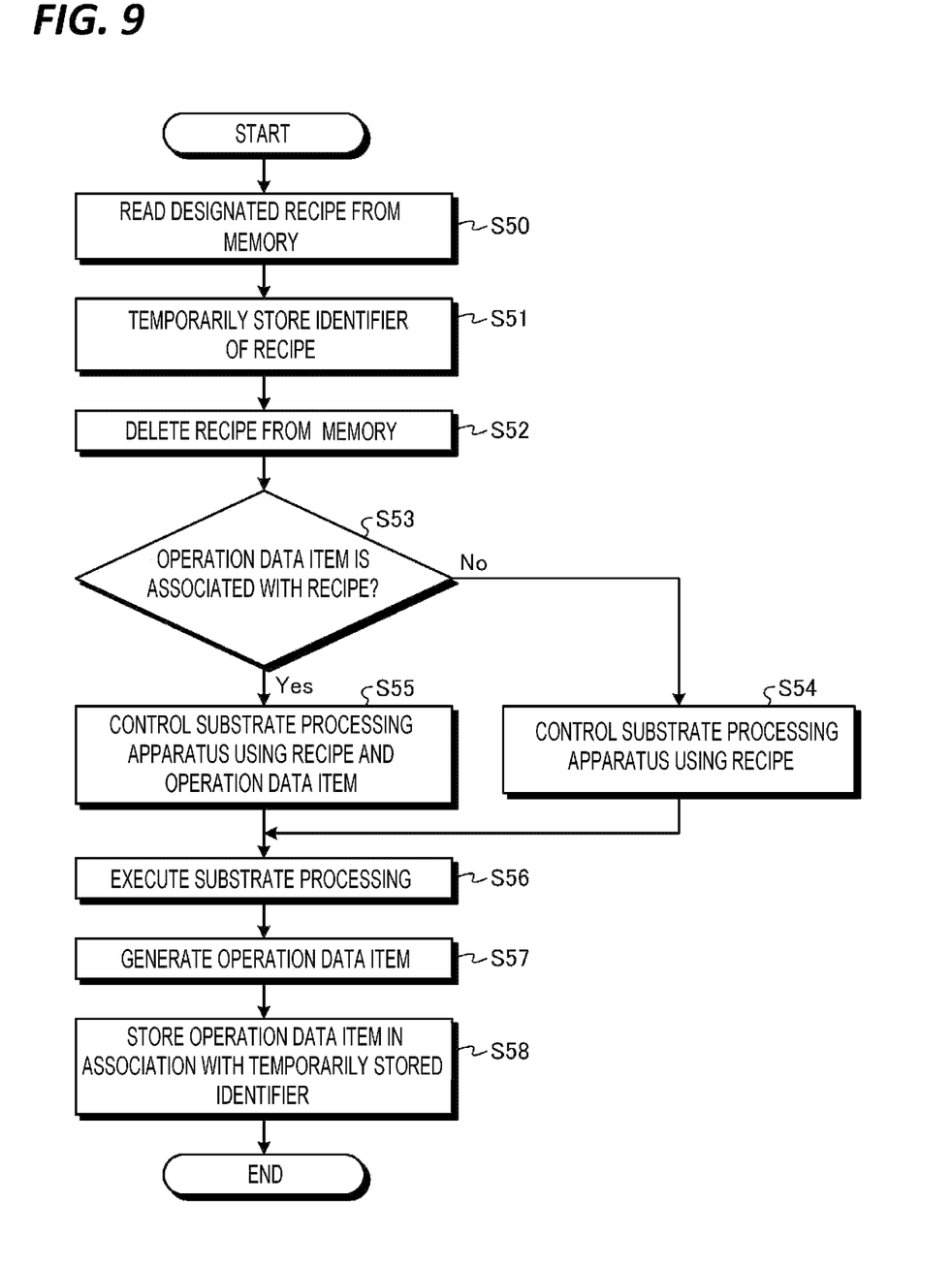
FIG. 9 is a flow chart illustrating an example of the flow of the substrate processing according to the embodiment.

Next, the flow of the substrate processing will be described. FIG. 9 is a flow chart illustrating an example of the flow of the substrate processing according to the embodiment. The substrate processing is executed at a predetermined timing, for example, at a timing at which the recipe 301 to be subjected to substrate processing is designated by the user interface 202. The recipe 301 may be designated by the management device 300 or another terminal device via the network N.

The control unit 213 reads the designated recipe 301 from the memory 203 into the internal memory (step S50). When the operation data item is associated with the designated recipe 301, the control unit 213 also reads the operation data item from the memory 203 into the internal memory. For example, the control unit 213 also reads the operation data 220 associated with the recipe 301 from the memory 203 into the internal memory.

The storage unit 216 temporarily stores the identifier of the designated recipe 301 in the internal memory (step S51). For example, the storage unit 216 temporarily stores the check code calculated from the recipe 301.

The deletion unit 215 deletes the recipe 301 stored in the memory 203 (step S52).

The control unit 213 determines whether the operation data item is associated with the recipe 301 stored in the internal memory (step S53). For example, the determination unit 212 determines whether the operation data 220 is associated with the recipe 301.

When it is determined that the operation data item is not associated with the recipe 301 (step S53: No), the control unit 213 controls the substrate processing apparatus 100 using the received recipe 301 (step S54). For example, the control unit 213 creates a processing schedule from the recipe 301.

Meanwhile, when it is determined that the operation data item is associated with the recipe 301 (step S53: Yes), the control unit 213 controls the substrate processing apparatus 100 by using the operation data item and the received recipe 301 (step S55). For example, the control unit 213 creates a processing schedule using the associated operation data 220 and the received recipe 301.

The control unit 213 executes the substrate processing of the processing conditions included in the recipe 301 stored in the internal memory according to the created processing schedule (step S56). When it is determined that the operation data 220 is associated with the recipe 301, the control unit 213 controls the substrate processing by using the model data 222 included in the operation data 220. For example, the control unit 213 uses the process model data stored in the model data 222 to adjust the process temperature of each process module PM so that the substrate processing rate of each process module PM becomes a predetermined rate according to the processing conditions. Further, the control unit 213 calculates the abnormality detection threshold value corresponding to the processing conditions for each process module PM by using the FD model data stored in the model data 222.

The generation unit 214 generates an operation data item when the recipe 301 stored in the internal memory is executed (step S57). For example, the generation unit 214 generates the operation data 220 that stores the performance values of the substrate processing when the substrate processing is performed under the control of the control unit 213.

The storage unit 216 stores the generated operation data item in the memory 203 in association with the temporarily stored identifier (step S58), and ends the process. For example, the storage unit 216 stores the operation data 220 in the memory 203 in association with the temporarily stored check code after the substrate processing under the control of the control unit 213 is completed.

As described above, the information processing apparatus 200 according to the present embodiment is connected to the substrate processing apparatus 100. The information processing apparatus 200 includes a memory 203 and a processor (process controller 204). The memory 203 stores the operation data item (operation data 220) created when the recipe 301, which is the processing condition of the substrate processing apparatus 100, is executed in association with the identifier (check code) calculated from the recipe 301. The processor includes a reception unit 210, a calculation unit 211, a determination unit 212, and a control unit 213. The reception unit 210 receives a processing instruction including the recipe 301. The calculation unit 211 calculates an identifier (check code) from the recipe 301 received by the reception unit 210. The determination unit 212 determines whether the same identifier as the calculated identifier is stored in the memory 203. When the determination unit 212 determines that the same identifier is stored in the memory 203, the control unit 213 controls the substrate processing apparatus 100 by using the operation data item associated with the identifier and the recipe 301 received by the reception unit 210. As a result, the information processing apparatus 200 may suppress a decrease in productivity.

Further, the recipe 301 according to the present embodiment includes an identifier (recipe ID). The determination unit 212 determines a match using two or more identifiers including the identifier included in the recipe 301 and the calculated identifier (check code). As a result, even when a part of the processing conditions is changed and the recipe 301 to which the same recipe ID is assigned is received, the information processing apparatus 200 may identify that the recipe 301 is different. Further, when the recipe 301 having the same processing conditions and recipe ID as in the past is transmitted again, since the information processing apparatus 200 may control the substrate processing apparatus 100 by using the operation data item when actually performing the substrate processing of the recipe 301, the substrate processing may be efficiently performed.

Further, the calculation unit 211 according to the present embodiment calculates an error detection code as an identifier from the received recipe 301. As a result, even when the recipe ID is the same, the information processing apparatus 200 may simply determine from the error detection code whether the internal data such as the processing conditions are different for the recipe 301.

Further, the operation data item according to the present embodiment includes the processing time when the substrate processing of the recipe 301 is performed. When the operation data item associated with the identifier of the received recipe 301 is stored in the memory 203, the control unit 213 controls the substrate processing apparatus 100 by using the processing time included in the operation data item. As a result, even when a difference exists in the processing time of the substrate processing for each process module PM of the substrate processing apparatus 100, the information processing apparatus 200 may create a processing schedule according to the processing time of the substrate processing of each process module PM, and perform an efficient substrate processing.

Further, the operation data item according to the present embodiment includes model data 222 relating to the control of the substrate processing of the recipe 301. When the operation data item associated with the identifier of the received recipe 301 is stored in the memory 203, the control unit 213 controls the substrate processing apparatus 100 by using the model data 222 included in the operation data item. Thus, the information processing apparatus 200 may appropriately control the substrate processing by using the model data 222.

Further, the reception unit 210 according to the present embodiment stores the received recipe 301 in the memory 203. The control unit 213 reads the recipe 301 from the memory 203 into the temporary memory (internal memory), and controls the substrate processing apparatus 100 based on the recipe 301 stored in the temporary memory. The deletion unit 215 deletes the recipe 301 from the memory 203 when the reading of the recipe 301 by the control unit 213 is completed. As a result, the information processing apparatus 200 may suppress the leakage of the recipe 301.

Although the embodiments have been described above, the embodiments disclosed this time need to be considered as illustrative in all points and not restrictive. Indeed, the embodiments described above may be implemented in a variety of forms. Also, the embodiments described above may be omitted, substituted, or changed in various forms without departing from the scope of the appended claims and the subject matter thereof.

For example, in the embodiment, as an example, descriptions have been made on the case where the control unit 213 creates the processing schedule of each process module PM in advance. However, the present disclosure is not limited thereto. The control unit 213 may change the processing schedule of each process module PM in real time according to the processing status of each process module PM during processing. For example, the control unit 213 may determine operation patterns in association with the predicted processing time of each process module PM and operate in the operation pattern according to the processing status of the process module PM. When the operation data 220 associated with the identifier of the recipe 301 to be executed is stored in the memory 203, the control unit 213 determines operation patterns by using the operation data 220. For example, the control unit 213 uses the processing time of the process module PM recorded in the operation data 220 as a reference, and determines an operation pattern for each process module PM when different processing times exist, such as when the processing time is shorter than the reference or when the processing time is longer than the reference. Then, the control unit 213 may change the processing schedule of each process module PM in real time by selecting an operation pattern according to the actual processing time of each process module PM.

Further, in the embodiment, as an example, descriptions have been made on the case where the error detection code is used as the identifier of the recipe 301. However, the present disclosure is not limited thereto. For example, the identifier of recipe 301 may be a recipe ID. Further, a plurality of types of check codes may be used as the identifiers of the recipe 301. Also, the recipe 301 may be assigned an identification code such as a unique ID in addition to the recipe ID, and the identification code may be used as an identifier. For example, the management device 300 may assign the same identification code to the recipe 301 having the same processing conditions, and transmit the recipe ID differently each time. Even in this case, when the operation data 220 associated with the identification code of the recipe 301 is stored in the memory 203, the substrate processing apparatus 100 may efficiently perform the substrate processing by creating a processing schedule for the substrate processing using the operation data 220.

Further, in the embodiment, as an example, descriptions have been made on the case where the control unit 213 reads the recipe 301 into the internal memory at the start of the substrate processing, and when the reading is completed, the deletion unit 215 deletes the recipe 301 stored in the memory 203. However, the present disclosure is not limited thereto. For example, the control unit 213 may read the recipe 301 from the memory 203 during the substrate processing at any time. The deletion unit 215 may delete the recipe 301 stored in the memory 203 at the end of the substrate processing.

Further, in the above-described embodiment, the case where the substrate is a semiconductor wafer has been described as an example, but the present disclosure is not limited thereto. The semiconductor wafer may be silicon or a compound semiconductor such as GaAs, SiC, or GaN. Further, the substrate is not limited to the semiconductor wafer, and may be applied to a glass substrate used for a flat panel display (FPD) such as a liquid crystal display device, and a ceramic substrate.

DESCRIPTION OF SYMBOLS

100: substrate processing apparatus
200: information processing apparatus
201: communication interface
202: user interface
203: memory
204: process controller
210: reception unit
211: calculation unit
212: determination unit
213: control unit
214: generation unit
215: deletion unit
216: storage unit
300: management device
301: recipe 220: operation data
221: performance data
222: model data
PM, PM1 to PM4: process module
W: wafer

What is claimed is:

1. An information processing apparatus connected to a substrate processing apparatus, the information processing apparatus comprising:
   a memory configured to store an operation data item created when a recipe serving as a processing condition of the substrate processing apparatus is executed, in association with an identifier calculated from the recipe; and
   a processor coupled to the memory and configured to process an overall operation of the information processing apparatus,
   wherein the processor includes:
      reception circuitry configured to receive a processing instruction including a recipe;
      calculation circuitry configured to calculate an identifier from the recipe received at the reception circuitry;
      determination circuitry configured to determine whether an identical identifier to the calculated identifier is stored in the memory; and
      control circuitry configured to:
         when the determination circuitry determines that the identical identifier is stored in the memory, control the substrate processing apparatus using the recipe received at the reception circuitry and the operation data item corresponding to the identical identifier, and
         control the substrate processing apparatus using the recipe received at the reception circuitry and the operation data item generated when the recipe, corresponding to the identical identifier, is executed.

2. The information processing apparatus according to claim 1, wherein the recipe includes an identifier, and the determination circuitry determines a match of identifiers using two or more identifiers including the identifier included in the recipe and the calculated identifier.

3. The information processing apparatus according to claim 1, wherein the calculation circuitry calculates an error detection code as the identifier from the received recipe.

4. The information processing apparatus according to claim 1, wherein the operation data item includes a processing time when a substrate processing of the recipe is executed, and the control circuitry controls the substrate processing apparatus using the processing time included in the operation data item when the operation data item associated with the identifier of the received recipe is stored in the memory.

5. The information processing apparatus according to claim 1, wherein the operation data item includes model data relating to a control of the substrate processing of the recipe, and when the operation data item associated with the identifier of the received recipe is stored in the memory, the control circuitry controls the substrate processing apparatus using the model data included in the operation data item.

6. The information processing apparatus according to claim 1, further comprising:
   generation circuitry configured to generate an operation data item when the substrate processing is executed by the substrate processing apparatus under a control of the control circuitry; and
   storage circuitry configured to, when the operation data item associated with the identifier included in the received recipe is not stored in the memory, store the operation data item generated by the generation circuitry in association with an identifier included in the received recipe, in the memory.

7. A substrate processing method comprising:
   receiving a processing instruction including a recipe serving as a processing condition of a substrate processing apparatus;
   calculating an identifier from the recipe received in the receiving;
   determining whether an identical identifier to the calculated identifier is stored in a memory in which an operation data item created when the recipe is executed is stored in association with the identifier calculated from the recipe in the calculating;
   when determined that the identical identifier is stored in the memory, controlling the substrate processing apparatus using the recipe received in the receiving and the operation data item corresponding to the identical identifier; and
   controlling the substrate processing apparatus using the recipe received in the receiving and the operation data item generated when the recipe, corresponding to the identical identifier, is executed.

* * * * *